US008623737B2

(12) United States Patent
Seh et al.

(10) Patent No.: US 8,623,737 B2
(45) Date of Patent: Jan. 7, 2014

(54) SOL-GEL AND MASK PATTERNING FOR THIN-FILM CAPACITOR FABRICATION, THIN-FILM CAPACITORS FABRICATED THEREBY, AND SYSTEMS CONTAINING SAME

(75) Inventors: Huankiat Seh, Phoenix, AZ (US); Yongki Min, Phoenix, AZ (US); Cengiz A. Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 11/396,386

(22) Filed: Mar. 31, 2006

(65) Prior Publication Data

US 2007/0228517 A1    Oct. 4, 2007

(51) Int. Cl.
 *H01L 21/20* (2006.01)
(52) U.S. Cl.
 USPC ............ 438/393; 438/396; 257/E21.008; 257/E21.009
(58) Field of Classification Search
 USPC ............ 438/396–399, 577, 670, 951, 393; 257/E21.009, E21.008
 See application file for complete search history.

(56) References Cited

U.S. PATENT DOCUMENTS

| | | | |
|---|---|---|---|
| 4,968,644 A * | 11/1990 | Gallagher et al. | 438/680 |
| 5,190,892 A * | 3/1993 | Sano | 438/670 |
| 5,252,831 A * | 10/1993 | Weiss | 250/370.11 |
| 5,578,845 A * | 11/1996 | Masuda et al. | 257/295 |
| 5,601,673 A * | 2/1997 | Alexander | 156/89.12 |
| 5,654,128 A * | 8/1997 | Hsu | 430/324 |
| 5,853,500 A | 12/1998 | Joshi et al. | |
| 5,886,867 A | 3/1999 | Chivukula et al. | |
| 6,077,715 A * | 6/2000 | Chivukula et al. | 438/3 |
| 6,156,672 A * | 12/2000 | Koshido et al. | 438/778 |
| 6,404,615 B1 * | 6/2002 | Wijeyesekera et al. | 361/306.1 |
| 6,507,478 B1 | 1/2003 | Sameshima | |
| 6,885,541 B2 | 4/2005 | Otsuka et al. | |
| 7,045,087 B2 * | 5/2006 | Kotov | 264/255 |
| 7,095,108 B2 | 8/2006 | Palanduz | |
| 7,704,683 B2 * | 4/2010 | Wittenberg et al. | 430/321 |

(Continued)

FOREIGN PATENT DOCUMENTS

| | | |
|---|---|---|
| EP | 0631319 B1 | 5/2002 |
| JP | 2002-509647 | 3/2002 |

(Continued)

OTHER PUBLICATIONS

Sedlar, M et al, "Sol-gel Processing and Properties of Cerium Doped Barium Strontium Titanate Thin Films", Jan. 1995, Journal of Sol-Gel Science and Technology, vol. 5, No. 3, pp. 201-210.*

(Continued)

*Primary Examiner* — Matthew Landau
*Assistant Examiner* — Joseph C Nicely
(74) *Attorney, Agent, or Firm* — Konrad Raynes Davda & Victor LLP; Alan S. Raynes

(57) ABSTRACT

A process of forming a thin-film capacitor that includes sol-gel patterning of a dielectric thin film on a first electrode, lift-off removal of unwanted dielectric thin film, and mating the dielectric thin film with a second electrode. The thin-film capacitor exhibits a substantially uniform heat-altered morphology along a line defined by a characteristic dimension thereof. A computing system is also disclosed that includes the thin-film capacitor.

28 Claims, 7 Drawing Sheets

(56) References Cited

U.S. PATENT DOCUMENTS

| | | | |
|---|---|---|---|
| 2002/0084456 A1* | 7/2002 | Sugihara et al. | 257/48 |
| 2002/0155626 A1 | 10/2002 | Park | |
| 2004/0194309 A1* | 10/2004 | Tokunaga et al. | 29/890.1 |
| 2004/0245556 A1* | 12/2004 | Farooq et al. | 257/296 |
| 2004/0246692 A1* | 12/2004 | Satoh et al. | 361/782 |
| 2004/0248047 A1* | 12/2004 | Kato | 430/313 |
| 2005/0082636 A1* | 4/2005 | Yashima et al. | 257/532 |
| 2005/0141169 A1* | 6/2005 | Yamasaki | 361/306.3 |
| 2005/0156279 A1* | 7/2005 | Shioga et al. | 257/532 |
| 2005/0214960 A1* | 9/2005 | Sato et al. | 438/17 |
| 2005/0248015 A1 | 11/2005 | Palanduz | |
| 2005/0275615 A1* | 12/2005 | Kahen et al. | 345/102 |
| 2006/0132461 A1* | 6/2006 | Furukawa et al. | 345/173 |
| 2008/0137264 A1* | 6/2008 | Suzuki et al. | 361/321.3 |
| 2009/0162974 A1* | 6/2009 | Kikuchi et al. | 438/106 |

FOREIGN PATENT DOCUMENTS

| | | | | |
|---|---|---|---|---|
| JP | 2002-324896 | | 11/2002 | |
| JP | 2005-191266 A | | 7/2005 | |
| KR | 10-0517234 B1 | | 9/2005 | |
| WO | 90/12755 A1 | | 11/1990 | |
| WO | WO 9709286 A1 | * | 3/1997 | C04B 35/447 |
| WO | 99/04421 | | 1/1999 | |
| WO | 2007/126912 A2 | | 11/2007 | |
| WO | 2007/126912 A3 | | 4/2008 | |

OTHER PUBLICATIONS

Petty-Weeks, Sande, "'Green' Dielectric Implementation in RF Modules", 2008,2008 Electronic Components and Technology Conference, pp. 968-972.*

Salama, I. A., et al., "Low Temperature Deposition and Ultra Fast Annealing of Integrated Circuit Thin Film Capacitor", U.S. Appl. No. 11/277,606, filed Mar. 27, 2006.

Seh, H., et al., "Injet Patterning for Thin-Film Capacitor Fabrication, Thin-Film Capacitors Fabricated Thereby, and Systems Containing Same", U.S. Appl. No. 11/396,394, filed Mar. 31, 2006.

International Search Report and Written Opinion for PCT Application No. PCT/US2007/007710, mailed on Feb. 13, 2008, 14 pages.

Office Action Received for Chinese Patent Application No. 200780012269.X mailed on Jun. 4, 2010, 13 Pages of Office Action including 8 pages of English Translation.

Office Action Received for Korean Patent Application No. 2008-7026563 mailed on Jul. 7, 2010, 5 Pages of Office Action only English Translation.

Office Action Received for Taiwanese Patent Application No. 096110605 mailed on Dec. 2, 2010, 15 Pages of Office Action including 7 pages of English Translation.

International Preliminary Report on Patentability received for PCT Patent Application No. PCT/US2007/007710, mailed on Oct. 9, 2008, 9 pages.

Office Action Received for Taiwanese Patent Application No. 096110605 mailed on May 23, 2011, 12 Pages of Office Action including 5 pages of English Translation.

Office Action Received for Chinese Patent Application No. 200780012269.X mailed on Dec. 8, 2011, 7 Pages of Office Action including 4 pages of English Translation.

Office Action Received for Korean Patent Application No. 2008-7026563 mailed on May 26, 2011, 1 Page of Office Action only English Translation.

Notice of Allowance 1 for KR Application No. 10-2008-7026563, dated Nov. 30, 2011, 3 pp. [77.260KR (NOA1)].

Office Action 1 for JP Application No. 2009-502984, dated Feb. 28, 2012, 9 pp. [77.260JP (OA1)].

Office Action 2 for JP2009-502984, dated Aug. 28, 2012, 8 pp. [w/ Engl Trans] [77.260JP (OA2)].

Office Action 3 for TW096110605, dated Jul. 22, 2012, 15 pp. [w/ Engl Trans] [77.260TW (OA3)].

Office Action 3 for CN Application No. 200780012269.X, dated Oct. 29, 2012, 16 pp. [77.260CN (OA3)].

* cited by examiner

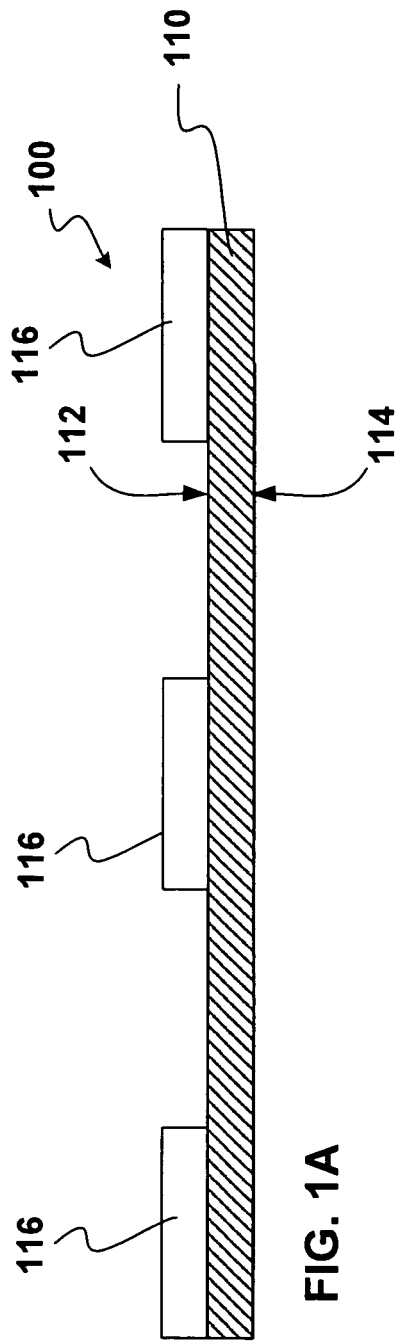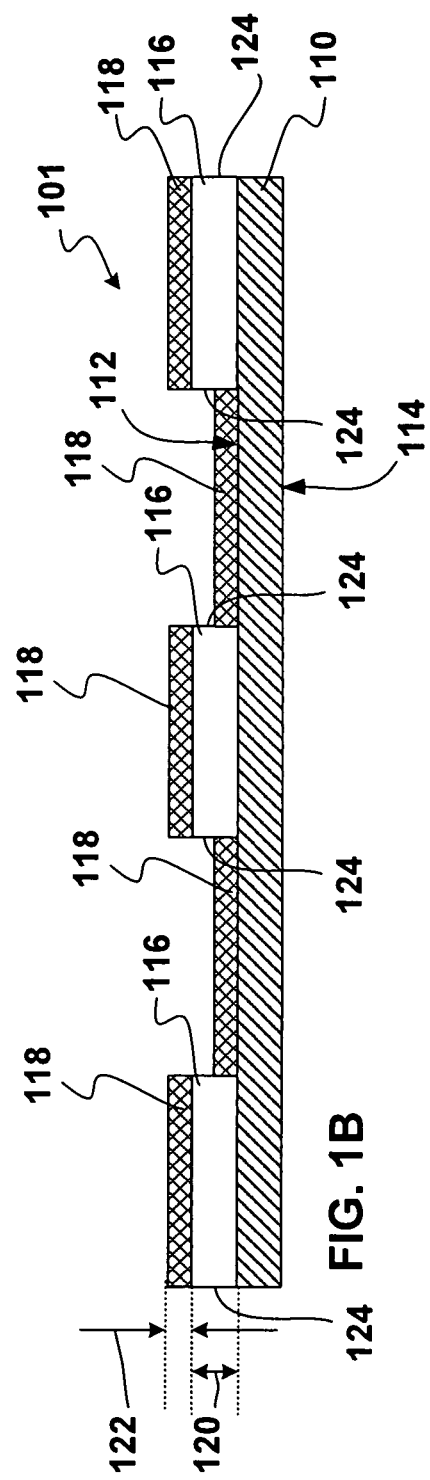

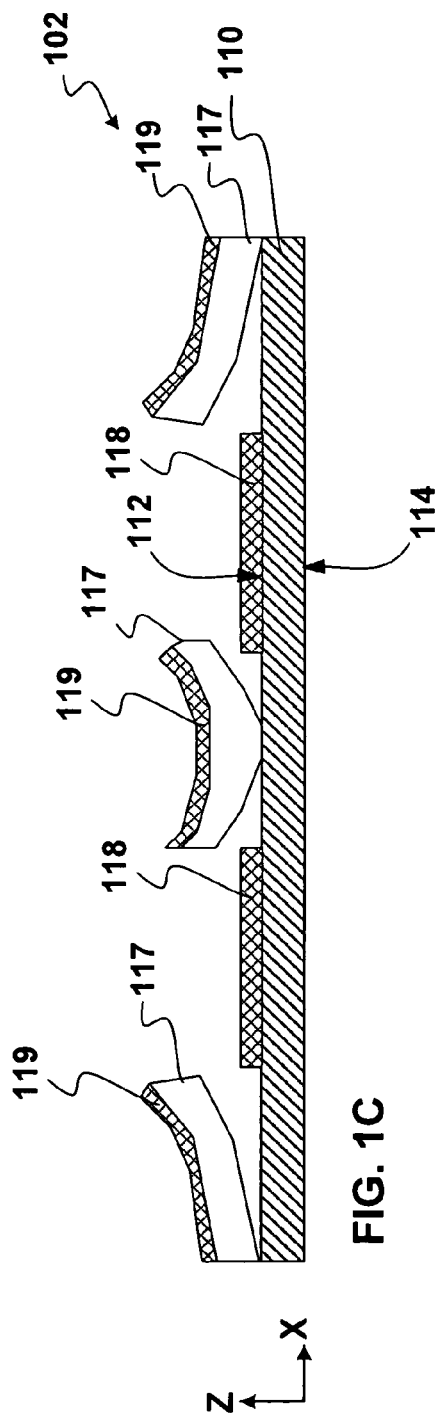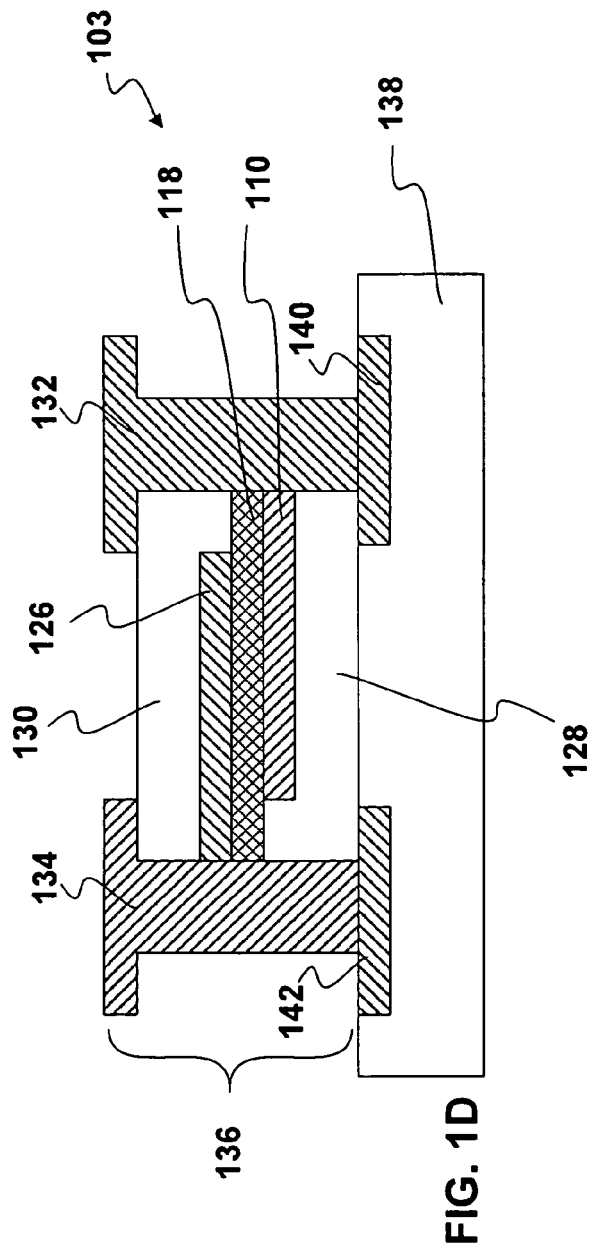

US 8,623,737 B2

SOL-GEL AND MASK PATTERNING FOR THIN-FILM CAPACITOR FABRICATION, THIN-FILM CAPACITORS FABRICATED THEREBY, AND SYSTEMS CONTAINING SAME

TECHNICAL FIELD

Disclosed embodiments relate to a plate capacitor assembly.

BACKGROUND INFORMATION

A processor die often requires capacitative power sources to respond to transient loads generated during operation. Capacitors are provided to answer the transient load requirements of the die. A thin-film capacitor (TFC) is typically a dielectric disposed between two electrodes, and which was manufactured by laser drilling. Laser drilling is costly, time consuming, and subjects the structures of the TFC to significant uneven heat transients. High dielectric-constant (high-k) thin-film capacitors (TFCs) must be laser drilled or chemically etched after sintering to provide electrical contacts. These processes can affect the chemistry of the sintered high-k dielectrics. The laser drilling can create a non-uniform laser heat zone, or the etching chemistry can alter the high-k dielectric at and near the etch edge.

During conventional laser-drill processing through a sintered thin-film capacitor (TFC) dielectric layer to form a contact corridor, the extreme heat transient of the laser beam causes a heat-altered region at the cutting edge of the laser drill. The laser-drilled edge is subjected to an extreme heat transient because of the laser-drilling process, but opposite from the cut edge, the sintered TFC dielectric can remain unchanged from the sintering process. The conventional laser-drill process can cause the laser-drilled edge to change physically or chemically compared to the region that is distant from the laser-drilled edge. For example the laser-drilled edge can embrittle in comparison to the region that is distant from the laser-drilled edge. Thus, the heat-altered morphology of the laser-drilled edge can exhibit embrittlement signs caused in a sintered dielectric. The embrittlement can be determined by physical probing among other techniques. The laser-drilled edge can also have changed chemical qualities due to lost or altered materials caused by the extreme heat transient. Thus, the heat-altered morphology of the laser-drilled edge can exhibit chemical depletion signs in a sintered dielectric. The changed chemical qualities can be determined by microscopic techniques such as by scanning electron microscopy (SEM) or ionic-coupled plasma (ICP) analysis. And due to the extreme heat transient of the laser-drilling process, the laser-drilled edge can even have incorporated volatilized stray materials into the matrix of the TFC dielectric in comparison to the distant region. Thus, the heat-altered morphology of the laser-drilled edge can exhibit chemical addition signs in a sintered dielectric. The changed chemical qualities can be determined by microscopic techniques such as by SEM or ICP analysis.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which:

FIG. 1A is a cross-section elevation of a thin-film capacitor assembly during processing according to an embodiment;

FIG. 1B is a cross-section elevation of the thin-film capacitor assembly depicted in FIG. 1A during processing according to an embodiment;

FIG. 1C is a cross-section elevation of the thin-film capacitor assembly depicted in FIG. 1B during processing according to an embodiment;

FIG. 1D is a cross-section elevation of the thin-film capacitor assembly depicted in FIG. 1C during processing according to an embodiment;

DETAILED DESCRIPTION

Figure 2:
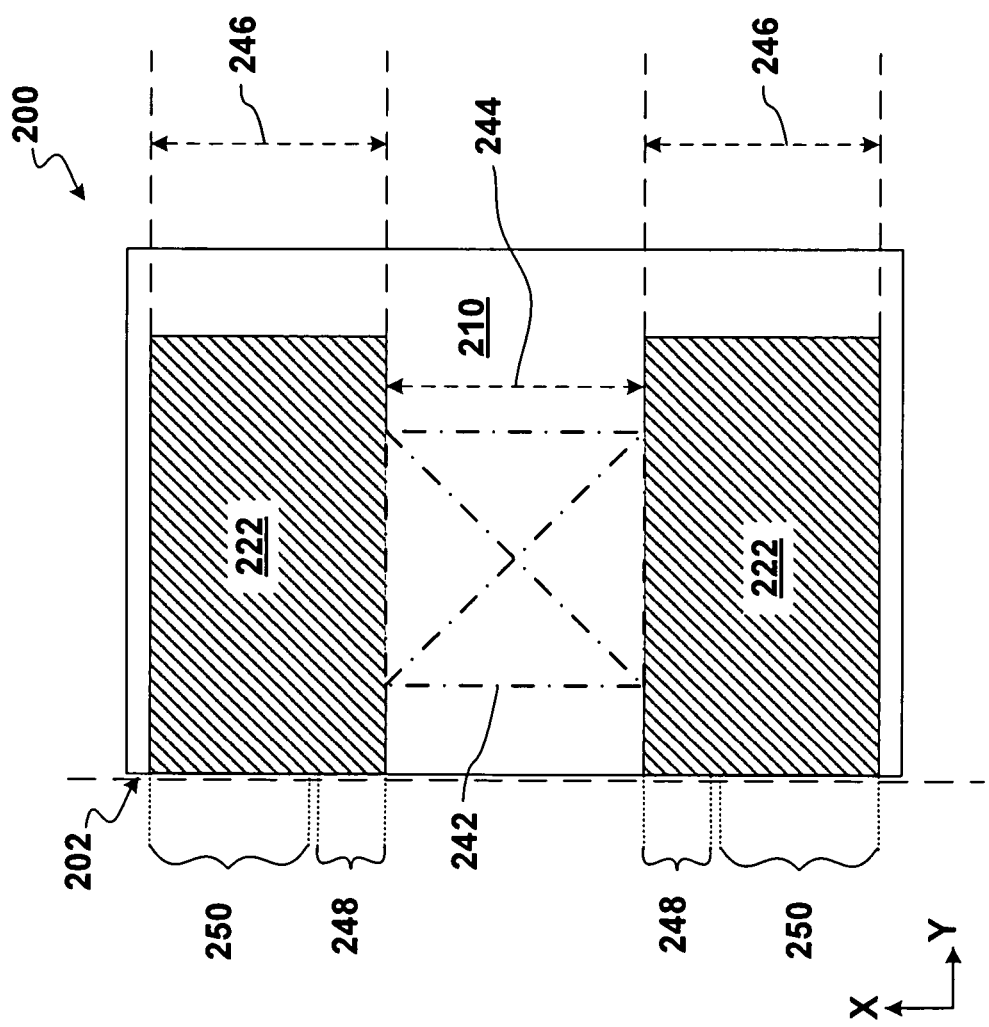
FIG. 2 is a top plan with a cut section of a thin-film capacitor assembly that has been processed according to an embodiment.

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

FIG. 1A is a cross-section elevation of a thin-film capacitor (TFC) assembly 100 during processing according to an embodiment. The TFC assembly 100 at this processing instant includes a first electrode 110 with an upper surface 112 and a lower surface 114. A mask 116 is patterned above the first electrode 110 upon the upper surface 112. In an embodiment, the mask 116 is susceptible to swelling and peeling during processing. In an embodiment, the mask 116 is liquid soluble such that a lift-off process is useful to remove it. In an embodiment, the mask 116 is vapor swellable such that a lift-off process is useful to remove it.

FIG. 1B is a cross-section elevation of the thin-film capacitor assembly depicted in FIG. 1A after further processing according to an embodiment. The TFC assembly 101 exhibits a green dielectric film 118 that is disposed upon the upper surface 112 of the first electrode 110 as well as upon the mask 116. In an embodiment, the green dielectric film 118 is a ceramic powder suspension film 118 that is resting upon the upper surface 112.

In an embodiment, the mask 116 includes a first thickness 120 and the green dielectric film 118 includes a second thickness 122. In an embodiment, the first thickness 120 is greater than the second thickness 122. In this embodiment because the mask first thickness 120 is greater than the green dielectric film second thickness 122, the mask 116 shows an exposed flank 124 that is susceptible to liquid or vapor insurgency for lift-off processing. In an embodiment, the first thickness 120 is about the same as the second thickness 122.

In an embodiment, the green dielectric film 118 includes a sol-gel solution of a titanate compound. In an embodiment, the green dielectric film 118 includes a sol-gel solution of a barium titanate compound. In an embodiment, the green dielectric film 118 includes a sol-gel solution of a strontium titanate compound. In an embodiment, the green dielectric film 118 includes a sol-gel solution of a barium-strontium titanate (BST) compound as a principal presence. "Principal presence" may mean the green dielectric film 118 will include about 100% of the titanate ceramic after sintering. It may also mean the green dielectric film 118 in a majority of BST. It may also mean the green dielectric film 118 is the dielectric material is less than 50%, but is the most prevalent dielectric material, from about 34% BST to about 49% BST if at least two other dielectrics are present for example. In an embodiment, any other ceramic dielectric is used as the green dielectric film 118, which is suitable for use as a TFC dielectric. In an embodiment, the second heating process is properly called annealing instead of sintering. In this embodiment, the first-cured dielectric film 118 is heated such that only fluid loss occurs, and the chemical nature thereof is not materially changed. Because specific applications may use sintering as defined or annealing as defined, for the purposes of disclosed and claimed embodiments, the terms sintering and annealing will be used synonymously.

Preparation of a sol-gel film 118 according to an embodiment includes blending titanium alkoxide and a strontium inorganic salt with methoxyelthanol and ethylene glycol. In an embodiment, preparation of a sol-gel film 118 according to an embodiment includes blending titanium alkoxide and a barium inorganic salt with methoxyelthanol and ethylene glycol. In an embodiment, preparation of a sol-gel film 118 according to an embodiment includes blending titanium alkoxide with a barium inorganic salt and a strontium inorganic salt, and with methoxyelthanol and ethylene glycol.

In an embodiment, application of the green dielectric film 118 to the first electrode 110 and the mask 116 is carried out by orthogonally spraying onto the exposed surfaces. In an embodiment, application thereof is carried out by spinning on a sol-gel liquid. In an embodiment, application thereof is carried out by dipping the first electrode 110 into a solution of a dielectric precursor liquid.

In an embodiment, a two-heating process is carried out. It is referred to as first curing, followed by second sintering. More generally, the process embodiment is referred to as first heating, followed by second heating. After application of the green dielectric film 118 to the first electrode 110 and the mask 116, a first curing process is carried out to partially stabilize the green dielectric film 118. In an embodiment, curing is carried out by heating the green dielectric film 118 sufficient to cause it to become non-flowable at room temperature. In an embodiment, the green dielectric film 118 has a thickness in a range from about 0.5 micrometer (μm) to about 30 μm. Thus, the non-flowable characteristic of the green dielectric film 118 is related to the thickness thereof and the resultant viscosity thereof after the first curing process.

In an embodiment, the first curing is carried out in a temperature range from abut 50° C. to about 150° C. and for sufficient time to cause the green dielectric film 118 to become non-flowable at room temperature. First curing also allows the green dielectric film 118 to become non-flowable at room temperature, but it also retains significant porosity in the first cured stage to allow for easier removal from selected areas.

FIG. 1C is a cross-section elevation of the thin-film capacitor assembly depicted in FIG. 1B after further processing according to an embodiment. In FIG. 1C, the TFC assembly 102 is illustrated during a lift-off process that is under way. The lift-off process causes the mask 117 (116 in FIG. 1B) to swell and/or lift. The green dielectric film 118, where it was patterned upon the first electrode 110 and not upon the mask 117, remains adherent to the first electrode 110. The green dielectric film 119 that was patterned upon the mask 117 also is in the process of being lifted off by virtue of the peeling and/or swelling mask 117.

After removal of the green dielectric film 119 that was in contact with the mask 117, the TFC assembly 102 is further processed by heating the green dielectric film 118 that remains to achieve a sintering thereof. In an embodiment, curing of the green dielectric film 118 includes at least some oxidation such that it is referred to as a calcining process. In an embodiment, sintering is carried out in a temperature range from about 700° C. to about 900° C. In order to protect the first electrode 110 from oxidation, a non-reactive atmosphere is provided during sintering. In an embodiment, a non-reactive atmosphere includes a non-reactive gas such as argon. In an embodiment, a non-reactive atmosphere includes a non-oxidizing gas such as nitrogen. In an embodiment, a non-reactive atmosphere includes a vacuum. In an embodiment, a non-reactive atmosphere includes a reduced atmospheric pressure such as in the 0.1 atmospheres (atm) range and lower, and a non-reactive gas such as argon. In an embodiment, a non-reactive atmosphere includes a reduced atmospheric pressure such as in the 0.01 atm range and lower, and a non-reactive gas such as argon.

In an embodiment, because of the dimensions of the structures in the TFC assemblies of this disclosure, sintering of the green dielectric film 118 achieves a substantially uniform heat-altered morphology of what has become a TFC dielectric layer 126 (FIG. 1D).

One parameter to monitor during sintering is the ratio of internal resistance to heat transfer of the green dielectric film 118, to the external resistance to heat transfer. The Biot modulus, known in heat-transfer technology, is a measure of the ratio of the internal resistance to the external resistance. In an embodiment, the internal resistance to heat transfer is minimized by evaluation of the Biot modulus in the Z-direction. Heat curing such as sintering therefore imposes a substantially uniform heat load upon the green dielectric film 118, such that as the first-cured dielectric film 118 is fully sintered, there exists a substantially uniform heat-altered morphology along any characteristic dimension in any direction, particularly in the X- and Y-directions. The Y-direction is into and out of the plane of the FIG.

FIG. 1D is a cross-section elevation of the thin-film capacitor assembly depicted in FIG. 1C after further processing according to an embodiment. In FIG. 1D, the TFC assembly 103 is depicted schematically. A second electrode 126 has been assembled to the TFC dielectric film 118 and to the first electrode 110. The TFC assembly 103 also includes a lower dielectric layer 128 and an upper dielectric layer 130, which protect the first electrode 110 and the second electrode 126, respectively. Further to the structure of the TFC assembly 103 are a first electrode contact 132 that contacts the first electrode 110, and a second electrode contact 134 that contacts the second electrode 126. The first electrode contact 132 and the second electrode contact 134 are formed in respective contact corridors that can be formed without extreme heat transients, such as laser drilling because of the process embodiments. The operative capacitor subsection of the TFC assembly 103 can also be referred to as a TFC assembly 136, which includes at least the first electrode 110, the TFC dielectric film 118, and the second electrode 126. The TFC assembly 136 is disposed upon a substrate 138. The respective first electrode contact 132 and the second electrode contact 134 are "pinned out" at a respective first bond pad 140 and second bond pad 142. In an embodiment, the TFC assembly 136 is provided without the substrate 138, and the respective first bond pad 138 and second bond pad 142 are integral to the respective first electrode contact 132 and the second electrode contact 134.

FIG. 2 is a top plan with a cut section 202, of a thin-film capacitor assembly 200 that has been processed according to an embodiment. The TFC assembly 200 is depicted as being "peeled" to lay open a plan view, and "cut" to expose part of a TFC dielectric layer. The TFC assembly 200 includes a first electrode 210 and two occurrences of a TFC dielectric film 222. The first electrode 210 also shows a contact-corridor footprint 242 that amounts to a spacing dimension 244 that is depicted between the two occurrences of the TFC dielectric film 222.

A characteristic dimension 246 of the TFC dielectric film 222 is depicted. The characteristic dimension 246 is selected to be any measuring line that can be laid across the TFC dielectric film 222 at a longest orthogonal configuration. The characteristic dimension 246 in FIG. 2 is depicted as traversing the TFC dielectric film 222 along the X-axis. Because of the thin nature of the TFC dielectric film 222, which thickness is defined along the minor axis, the characteristic dimension is not selected to be in the minor axis. For example in FIG. 2, the minor axis of the TFC dielectric film 222 is in the Z-direction, which is into and out of the plane of the FIG.

In an embodiment for chip-scale packaging of microelectronic dice, the characteristic dimension 246 for the TFC dielectric film 222 is in a range from about 100 micrometer (μm) to about 350 μm, and it can be along either of the X- or Y-axes. In an embodiment, the characteristic dimension 246 is about 200 μm.

During conventional laser-drill processing through a sintered TFC dielectric layer to form a contact corridor, an edge region 248 is heat altered in comparison to a rear region 250 of the TFC dielectric film 222. The edge region 248 is subjected to an extreme heat transient because of the laser-drilling process, but the rear region 250 has the benefit of both the edge region 248 and the first electrode 210 as heat sinks to resist the extreme heat transient. The conventional laser-drill process can cause the edge region 248 morphology to change compared to the rear region 250. For example the edge region 248 morphology can embrittle in comparison to the rear region 250. The edge region 248 morphology can also have changed chemical qualities due to lost or altered materials caused by the heat transient. And due to the extreme heat transient of the laser-drilling process, the edge region 248 morphology can even have incorporated volatilized stray materials into the matrix of the edge region 248 in comparison to the rear region 250.

According to an embodiment, because of sintering a completed positive pattern, the TFC dielectric film 222 occurs, and the heat-altered morphology of the TFC dielectric film 222 is substantially uniform along the direction defined by the characteristic dimension 246. This substantially uniform heat-altered morphology exhibits a known quality of the TFC dielectric film 222 at any location. Whether it is an edge region 248 or a rear region 248 of the TFC dielectric film 222, the heat-altered morphology is substantially uniform. In an embodiment, the TFC dielectric film 222 includes BST as a principal presence.

Figure 3:
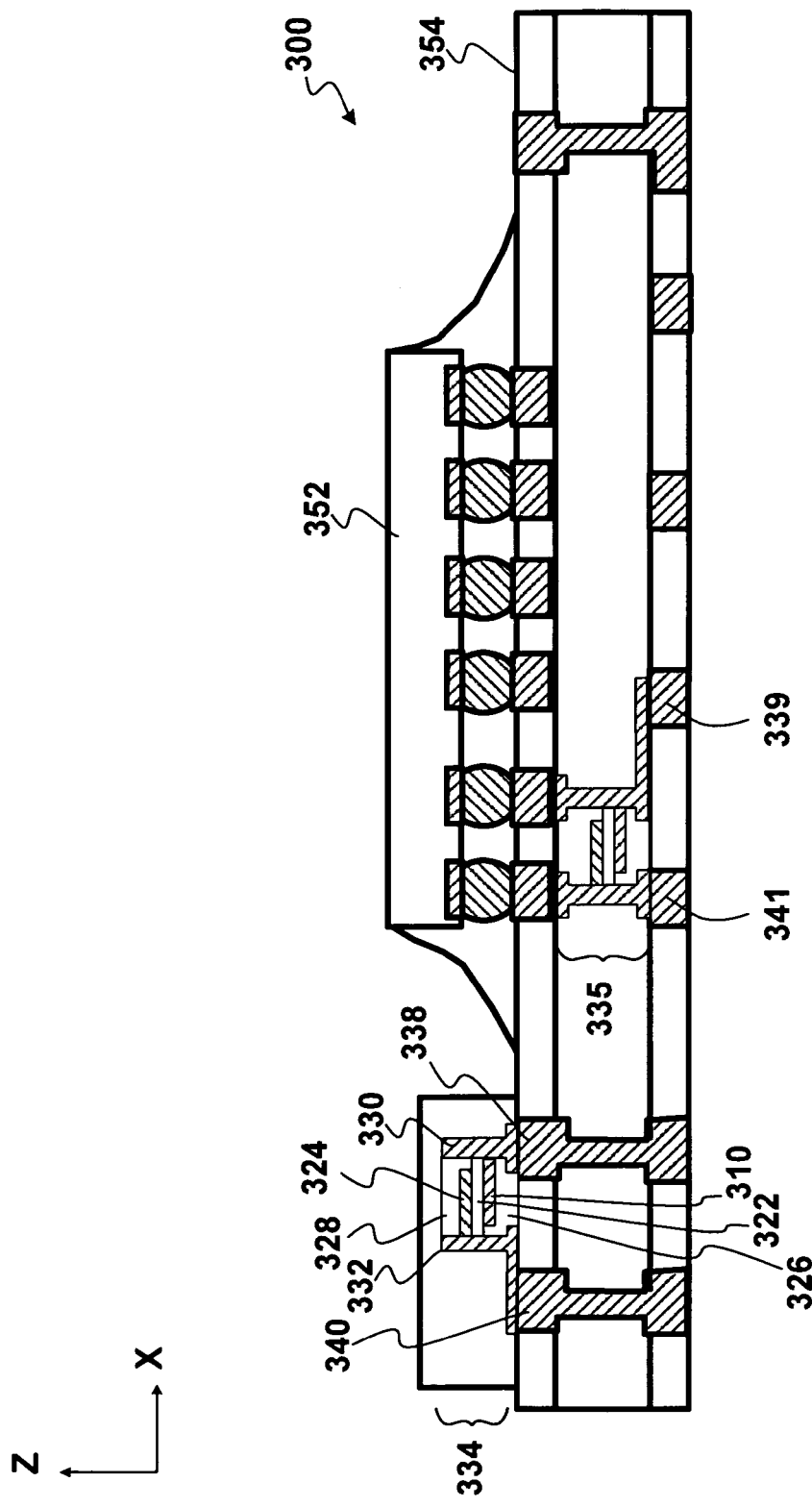
FIG. 3 is an cross-section elevation of a package that includes a thin-film capacitor assembly that was formed according to an embodiment.

FIG. 3 is a cross-section elevation of a package 300 that includes a thin-film capacitor assembly that was formed according to an embodiment. The package 300 includes a die 352 and a mounting substrate 354. Two occurrences of a TFC assembly 334 and 335 are depicted. In an embodiment, a TFC assembly 334 is disposed laterally to the die 352 and upon the mounting substrate 354. In an embodiment, a TFC assembly 335 is disposed below the die 352 and integral to the mounting substrate 354. In an embodiment, the die 352 is not present, but a die site occupies the same space on the mounting substrate 354 that a die can eventually occupy such as die 352, and the TFC assembly 335 is disposed below the die site and is integral to the mounting substrate 354.

The TFC assembly 334 that is disposed laterally to the die 352 is illustrated in greater detail. The TFC assembly 334 includes a first electrode 310 and a second electrode 324, which enclose a TFC dielectric film 322. In an embodiment, the TFC dielectric film 322 includes a BST powder as a principal presence. The TFC assembly 334 also includes a lower dielectric layer 326 and an upper dielectric layer 328, which protect the first electrode 310 and the second electrode 324, respectively. Further to the structure of the TFC assembly 334 is a first electrode contact 330 that contacts the first electrode 310, and a second electrode contact 332 that contacts the second electrode 324. The first electrode contact 330 and the second electrode contact 332 are formed in respective contact corridors that can be formed without extreme heat transients, such as laser drilling because the selected regions were removed before sintering.

The mounting substrate 354 is coupled to the TFC assembly 334 at a lower electrode bond pad 338 and to an upper electrode bond pad 340. The TFC assembly 335 that is disposed below the die 352, and that is also integral to the mounting substrate 354, includes a lower electrode bond pad 339 and an upper electrode bond pad 341 that emerge below the mounting substrate 354.

Figure 4:
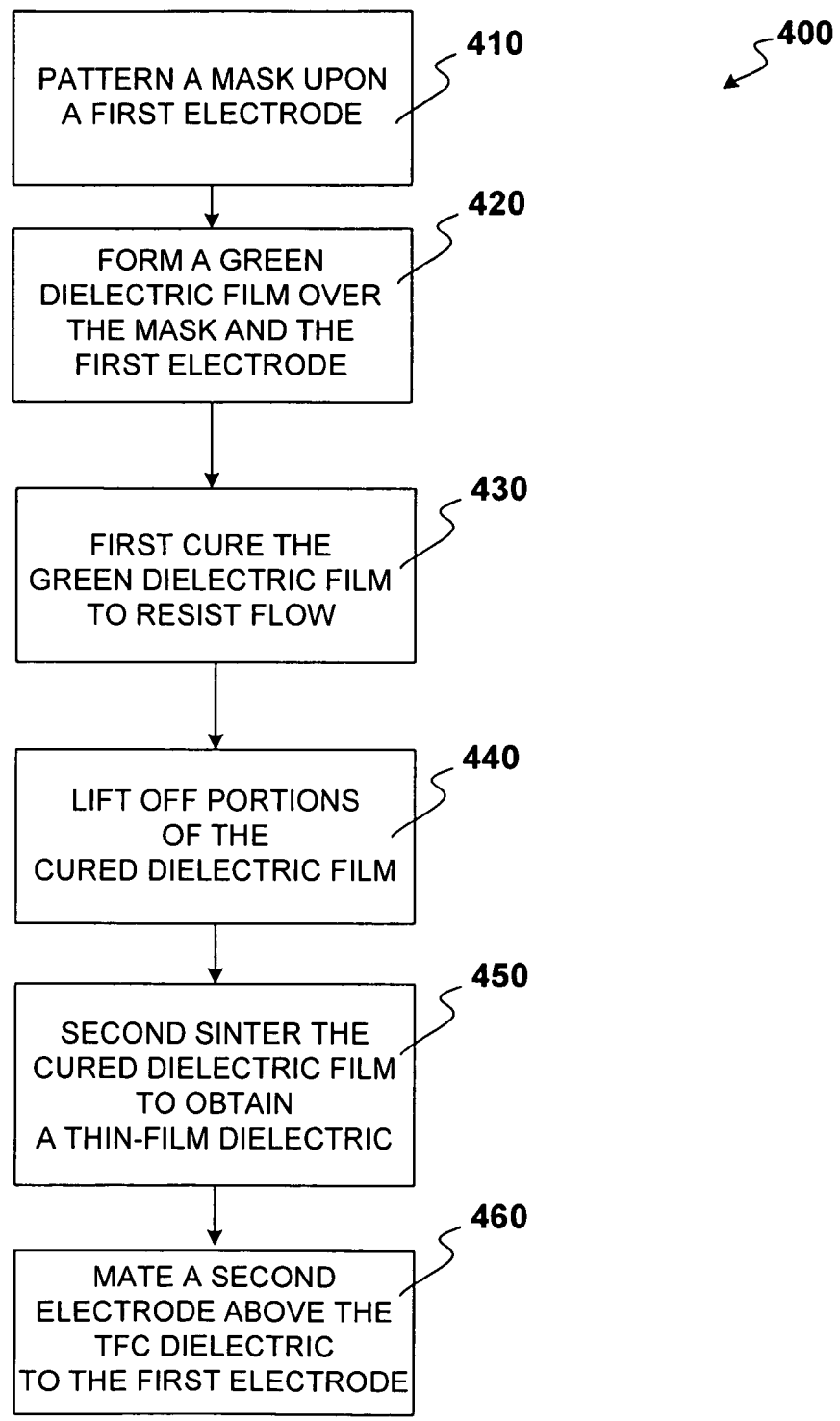
FIG. 4 is a process flow diagram according to various embodiments.

FIG. 4 is a process flow diagram 400 according to various embodiments.

At 410, the process includes patterning a mask upon a first electrode. By way of non-limiting example, the mask 116 in FIG. 1A is patterned upon the first electrode 110. Patterning can be done by spinning on a resist material and exposing the resist in preparation for a removing rinse.

At 420, the process includes forming a green dielectric film over the mask and the first electrode. By way of non-limiting example, the green dielectric film 118 is sprayed onto the mask 116 and onto the exposed portions of the first electrode 110 as depicted in FIG. 1B. The green dielectric film 118 is a sol-gel composition that is made from titanium alkoxide, a barium inorganic salt, a strontium inorganic salt, methoxyethanol, and ethylene glycol.

At 430, the process includes first curing the green dielectric film under conditions to resist flow thereof. By way of non-limiting example, the green dielectric film 118 is cured at about 130° C. for about three hours. This temperature and time cause the green dielectric film 118 to become non-flowable at room temperature.

At 440, the process includes lifting off portions of the cured dielectric film. In an embodiment, the entire structure is immersed in a peeling liquid that swells the mask and causes the mask-mated cured dielectric film to be removed.

At 450, the process includes second sintering the cured dielectric film to obtain a thin-film dielectric. In a non-limiting example, an 800° C. environment is provided and the atmosphere is below about 0.1 atm and in argon. The second sintering is carried out for about one hour. After the sintering, the TFC dielectric exhibits a substantially uniform morphology as set forth in this disclosure.

At 460, the process includes mating a second electrode to the TFC dielectric. The second electrode and the first electrode thus sandwich the TFC dielectric therebetween.

Figure 5:
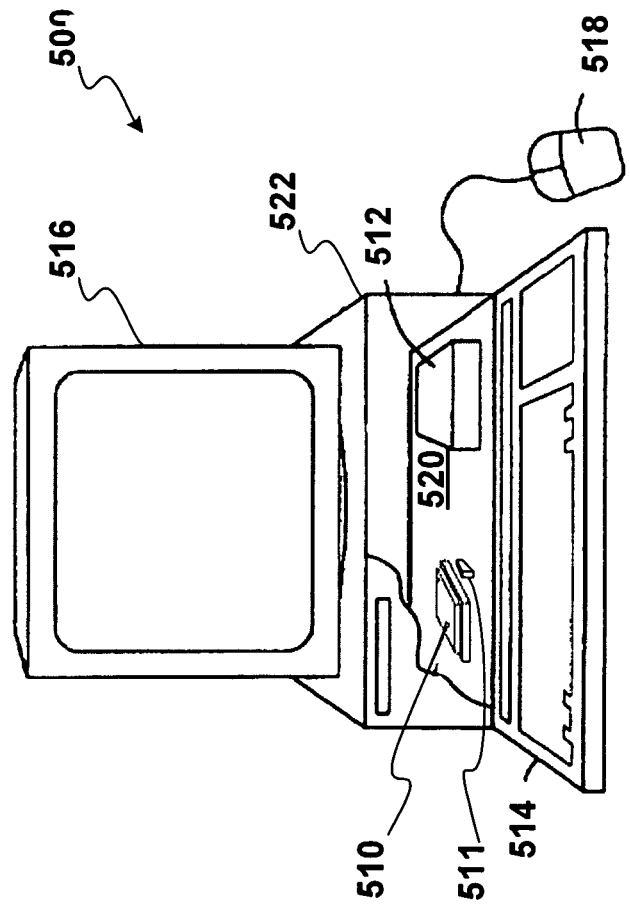
FIG. 5 is a cut-away perspective that depicts a computing system according to an embodiment.

FIG. 5 is a cut-away elevation that depicts a computing system 500 according to an embodiment. One or more of the foregoing embodiments of the thin-film capacitors may be utilized in a computing system, such as a computing system 500 of FIG. 5. Hereinafter any TFC embodiment alone or in combination with any other embodiment may be referred to as an embodiment(s) configuration.

The computing system 500 includes at least one processor (not pictured), which is enclosed in an IC chip package 510. A TFC 511 is depicted mounted next to the chip package 510 upon a board 520. In an embodiment, a TFC 511 is integral to the chip package 510. In an embodiment, the system 500 also includes a data storage system 512, at least one input device such as a keyboard 514, and at least one output device such as a monitor 516, for example. The computing system 500 includes a processor that processes data signals, and may include, for example, a microprocessor, available from Intel Corporation. In addition to the keyboard 514, the computing system 500 can include another user input device such as a mouse 518, for example. The computing system 500 can include a structure after processing as depicted in FIGS. 1A-1D and 3 of a TFC dielectric embodiment. In an embodiment, the computing system 500 includes a housing 522 such as the box for a desktop computer.

For purposes of this disclosure, a computing system 500 embodying components in accordance with the claimed subject matter may include any system that utilizes a microelectronic device system, which may include, for example, at least one of the TFC dielectric embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, the embodiment(s) configuration set forth in this disclosure is coupled to any of these functionalities. In an example embodiment, the data storage system 512 includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage system 512.

In an embodiment, the computing system 500 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on the board 520, which is a TFC dielectric embodiment. In this embodiment, an embodiment(s) configuration is coupled to the DSP, and a separate embodiment(s) configuration may be present that is coupled to the processor in the IC chip package 510. Additionally in an embodiment, an embodiment(s) configuration is coupled to a DSP that is mounted on the same board 520 as the IC chip package 510. It can now be appreciated that the embodiment(s) configuration can be combined as set forth with respect to the computing system 500, in combination with an embodiment(s) configuration as set forth by the various embodiments of the TFC dielectric within this disclosure and their equivalents.

It can now be appreciated that embodiments set forth in this disclosure can be applied to devices and apparatus other than a traditional computer. For example, a die can be packaged with an embodiment(s) configuration, and placed in a portable device such as a wireless communicator or a hand-held device such as a personal data assistant and the like. In this embodiment, the system housing can be a shell for a wireless telephone or the like. Another example is a die that can be packaged with an embodiment(s) configuration and placed in a vehicle such as an automobile, a locomotive, a watercraft, an aircraft, or a spacecraft.

Figure 6:
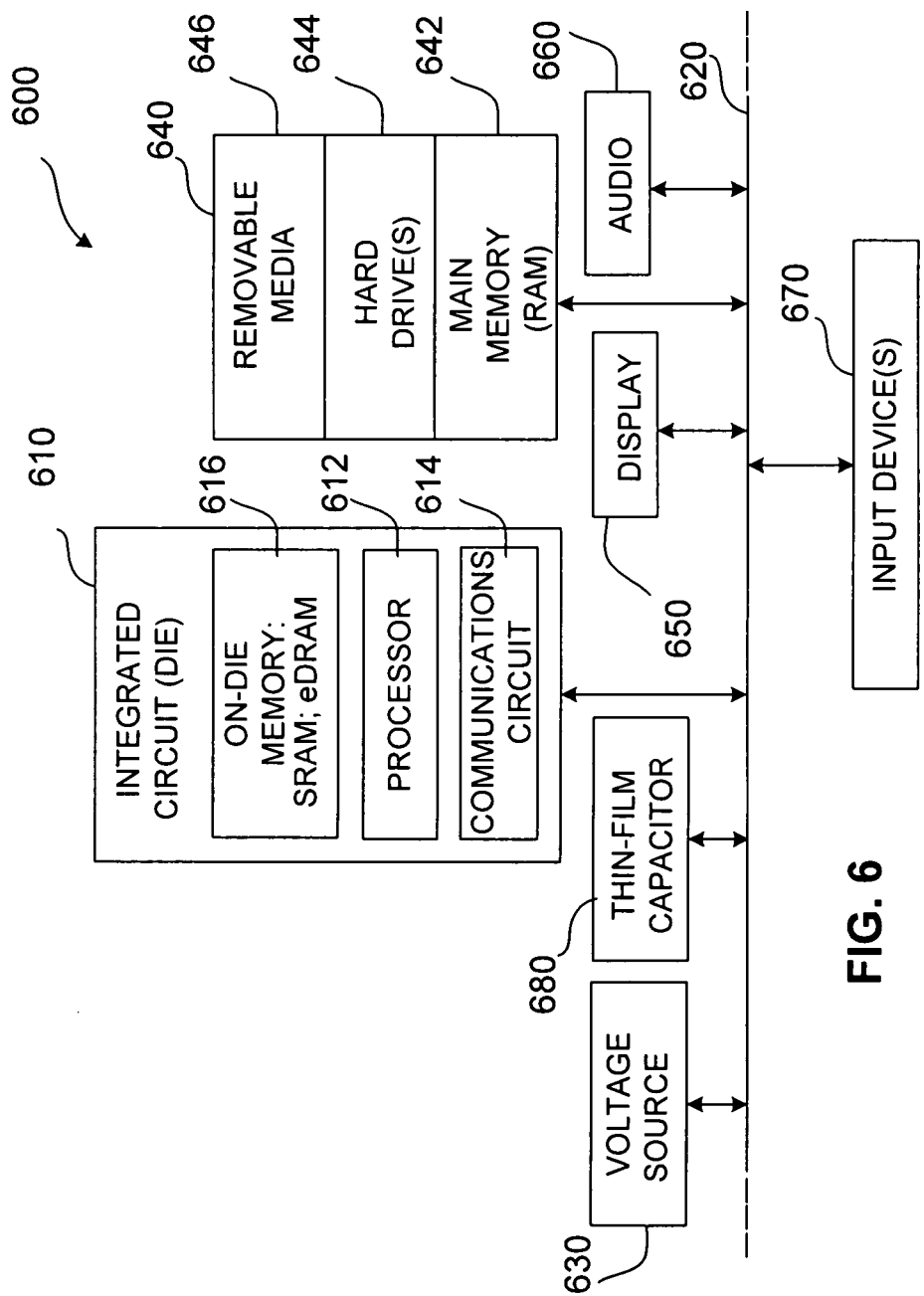
FIG. 6 is a schematic of an electronic system according to an embodiment.

FIG. 6 is a schematic of an electronic system 600 according to an embodiment. The electronic system 600 as depicted can embody the computing system 500 depicted in FIG. 5, but the electronic system is depicted more generically. The electronic system 600 incorporates at least one mounting substrate, for example the board 520 depicted in FIG. 5, with an electronic assembly 610, such as an integrated circuit die. In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620. In an embodiment, a TFC assembly 680 is electrically located between the voltage source 630 and the integrated circuit 610. Such location in an embodiment is in a mounting substrate and the TFC assembly 680 is integral to the mounting substrate. Such location of the TFC assembly 680 in an embodiment is upon a mounting substrate that provides a seat for the integrated circuit 610 and the TFC assembly 680, such as a processor and a TFC component, each mounted laterally and adjacent to the other on a board.

The integrated circuit 610 is electrically coupled to the system bus 620 and includes any circuit, or combination of circuits, according to an embodiment. In an embodiment, the integrated circuit 610 includes a processor 612 that can be of any type. As used herein, the processor 612 means any type of circuit such as, but not limited to, a microprocessor, a microcontroller, a graphics processor, a digital signal processor, or another processor. Other types of circuits that can be included in the integrated circuit 610 are a custom circuit or an ASIC, such as a communications circuit 614 for use in wireless devices such as cellular telephones, pagers, portable computers, two-way radios, and similar electronic systems. In an embodiment, the processor 610 includes on-die memory 616 such as SRAM. In an embodiment, the processor 610 includes on-die memory 616 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital video disks (DVDs), flash memory keys, and other removable media known in the art.

In an embodiment, the electronic system 600 also includes a display device 650 or an audio output 660. In an embodiment, the electronic system 600 includes an input device 670, such as a keyboard, mouse, trackball, game controller, microphone, voice-recognition device, or any other device that inputs information into the electronic system 600.

As shown herein, the integrated circuit 610 can be implemented in a number of different embodiments, including an electronic package, an electronic system, a computer system, one or more methods of fabricating an integrated circuit, and one or more methods of fabricating an electronic assembly that includes the integrated circuit mounted on a board and the TFC assembly embodiments as set forth herein in the various embodiments and their art-recognized equivalents. The elements, materials, geometries, dimensions, and sequence of operations can all be varied to suit particular packaging requirements.

In the foregoing Detailed Description, various features may be grouped together in a single embodiment for the purpose of simplifying the disclosure. This method of disclosure is not to be interpreted as reflecting an intention that the claimed embodiments of the disclosure require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of embodiments may be made without departing from the principles and scope of the disclosure as expressed in the subjoined claims.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

What is claimed is:

1. A process comprising:
    patterning a mask upon a first electrode;
    forming a green dielectric film on the first electrode to achieve a positive pattern that is complementary to the mask;
    the green dielectric film having a thickness in the range of 0.5 µm to 30 µm;
    lifting off the mask to achieve a positive-pattern green dielectric film; and
    after the lifting off the mask, sintering the positive-pattern green dielectric film to obtain a sintered dielectric.

2. The process of claim 1, including curing the positive-pattern green dielectric film prior to the lifting off the mask.

3. The process of claim 1, including curing the green dielectric film prior to the lifting off the mask, wherein the green dielectric film is formed by a sol-gel process, and wherein the curing is carried out at a temperature in a range from 50° C. to 150° C.

4. The process of claim 1, wherein lifting off the mask includes wet dissolving the mask.

5. The process of claim 1, wherein lifting off the mask includes vapor swelling the mask.

6. The process of claim 1, wherein sintering is carried out in a temperature range from 700° C. to 900° C.

7. The process of claim 1, wherein sintering is carried out in a temperature range from 700° C. to 900° C., and in a non-reactive atmosphere.

8. The process of claim 1, wherein sintering is carried out in a temperature range from 700° C. to 900° C., and in a vacuum.

9. The process of claim 1, further including:
    curing the positive-pattern green dielectric film before the sintering the positive-pattern green dielectric film, wherein the curing is carried out at a temperature in a range from 50° C. to 150° C.;
    wherein the sintering is carried out in a temperature range from 700° C. to 900° C., and in a non-reactive atmosphere selected from a non-reactive gas, a reduced-atmosphere gas, and a vacuum; and
    mating a second electrode to the sintered dielectric film.

10. The process of claim 1, wherein forming the positive-pattern green dielectric film includes forming a sol-gel composition, including titanium alkoxide, a barium inorganic salt, methoxyethanol and ethylene glycol.

11. The process of claim 1, wherein forming the positive-pattern green dielectric film includes forming a sol-gel composition, including titanium alkoxide, a strontium inorganic salt, methoxyethanol and ethylene glycol.

12. The process of claim 1, wherein forming the positive-pattern green dielectric film includes forming a sol-gel composition, including titanium alkoxide, a barium inorganic salt, a strontium inorganic salt, methoxyethanol and ethylene glycol.

13. The process of claim 1, wherein the mask has a first thickness, wherein the green dielectric film is formed of a sol-gel that has a second thickness, and wherein the first thickness is equal to or greater than the second thickness.

14. The process of claim 1, further including:
    forming a second electrode on the sintered dielectric, wherein the sintered dielectric is positioned between and contiguous the first electrode and the second electrode;
    positioning a lower dielectric layer in contact with the first electrode;
    positioning an upper dielectric layer in contact with the second electrode;
    forming a first electrode contact electrically coupled to the first electrode and extending from the lower dielectric layer to the upper dielectric layer;
    forming a second electrode contact electrically coupled to the second electrode and extending from the lower dielectric layer to the upper dielectric layer;
    wherein the forming the first electrode contact and the forming the second electrode contact are carried out without laser drilling through the sintered dielectric.

15. A process comprising:
    patterning a mask upon a first electrode;
    forming a sol-gel titanate green dielectric film upon the first electrode to achieve a positive pattern that is complementary to the mask, wherein forming is selected from dipping, spraying, and spinning;
    curing the sol-gel titanate green dielectric film at a temperature range from 50° C. to 150° C.;
    after the curing, lifting off the mask to achieve a positive-pattern green dielectric film, wherein the positive-pattern green dielectric film has a thickness in the range of 0.5 µm to 30 µm, and wherein lifting off the mask is selected from liquid peeling, vapor swelling, and a combination thereof;

after the lifting off the mask, sintering the positive-pattern green dielectric film to obtain a sintered titanate dielectric film, wherein the sintering is carried out at a greater temperature than the curing; and mating the sintered titanate dielectric film to a second electrode to achieve a thin-film capacitor, wherein the sintered titanate dielectric film is above and on the first electrode and below and on the second electrode.

16. The process of claim 15, further including assembling the thin-film capacitor with a structure selected from a microelectronic die, a mounting substrate, and a board;

wherein the assembling includes forming a thin-film capacitor assembly including a lower dielectric layer and an upper dielectric layer, wherein the thin film capacitor is positioned between the lower dielectric layer and the upper dielectric layer;

wherein the forming a thin-film capacitor assembly also includes a first electrode contact electrically coupled to the first electrode and a second electrode contact electrically coupled to the second electrode, wherein the first electrode contact and the second electrode contact are formed without laser drilling into the sintered titanate dielectric film; and wherein the thin film assembly is coupled to the structure selected from the microelectronic die, the mounting substrate, and the board.

17. The process of claim 15, wherein sintering is carried out in a temperature range from 700° C. to 900° C., and in a non-reactive atmosphere selected from a non-reactive gas, a reduced-atmosphere gas, and a vacuum.

18. A process comprising:
providing a patterned mask upon a first electrode, the patterned mask including openings exposing the first electrode;
forming a green dielectric film on the first electrode and on the mask;
first heating the green dielectric film to a first temperature to cure the green dielectric film;
after the first heating the green dielectric film, removing the mask;
after the removing the mask, second heating the cured green dielectric film in a non-reactive atmosphere to obtain a sintered dielectric; wherein the second heating is carried out at a higher temperature than the first heating;
forming a second electrode on the sintered dielectric, wherein the sintered dielectric is positioned between the first electrode and the second electrode;
positioning a lower dielectric layer in contact with the first electrode;
positioning an upper dielectric layer in contact with the second electrode;
forming a first electrode contact electrically coupled to the first electrode and extending from the lower dielectric layer to the upper dielectric layer; and
forming a second electrode contact electrically coupled to the second electrode and extending from the lower dielectric layer to the upper dielectric layer;
wherein the forming the first electrode contact and the forming the second electrode contact are carried out without laser drilling through the sintered dielectric.

19. The process of claim 18, wherein the cured green dielectric film is formed to have a thickness in the range of 0.5 microns to 30 microns.

20. The process of claim 18, wherein the forming the green dielectric film includes forming a sol-gel composition, including titanium alkoxide, a barium inorganic salt, methoxyelthanol, and ethylene glycol.

21. The process of claim 18, wherein the forming the green dielectric film includes forming a sol-gel composition, including titanium alkoxide, a strontium inorganic salt, methoxyelthanol, and ethylene glycol.

22. The process of claim 18, wherein the forming the green dielectric film includes forming a sol-gel composition, including titanium alkoxide, a barium inorganic salt, a strontium inorganic salt, methoxyelthanol, and ethylene glycol.

23. The method of claim 18, wherein the forming a green dielectric film on the first electrode and on the mask is carried out so that sidewalls defining the openings in the mask include an exposed area uncovered by the green dielectric film.

24. A process comprising:
patterning a mask upon a first electrode;
forming a sol-gel titanate film on the first electrode and on the mask and curing the sol-gel titanate film to obtain a cured sol-gel titanate film having a thickness in the range of 0.5 µm to 30 µm;
after the curing, lifting off the mask to achieve a positive-pattern cured sol-gel titanate film; and
after the lifting off the mask, heating the cured sol-gel titanate film in a non-reactive atmosphere to obtain a sintered titanate dielectric film.

25. The process of claim 24, further including forming a second electrode over the first electrode, wherein the positive patterning is disposed between and contiguous the first and second electrodes.

26. The process of claim 24, further including:
forming a second electrode over the first electrode, wherein the positive patterning is disposed between and contiguous the first and second electrodes; and
mating the sintered titanate dielectric film to the second electrode to achieve a thin-film capacitor, wherein the sintered titanate dielectric film is above and on the first electrode and below and on the second electrode;
positioning a lower dielectric layer in contact with the first electrode;
positioning an upper dielectric layer in contact with the second electrode;
forming a first electrode contact electrically coupled to the first electrode and extending from the lower dielectric layer to the upper dielectric layer; and
forming a second electrode contact electrically coupled to the second electrode and extending from the lower dielectric layer to the upper dielectric layer;
wherein the forming the first electrode contact and the forming the second electrode contact are carried out without laser drilling through the sintered titanate dielectric film.

27. The process of claim 24, further including:
forming a second electrode over the first electrode, wherein the positive patterning is disposed between and contiguous the first and second electrodes;
mating the sintered titanate dielectric film to the second electrode to achieve a thin-film capacitor, wherein the sintered titanate dielectric film is above and on the first electrode and below and on the second electrode; and
assembling the thin-film capacitor with a structure selected from a microelectronic die, a mounting substrate, and a board.

28. The process of claim 24, wherein the curing comprises heating the sol-gel titanate film at a temperature in the range of 50° C. to 150° C., and wherein the heating the sol-gel titanate film in a non-reactive atmosphere to obtain a sintered titanate dielectric film is carried out at a temperature in the range of 700° C. to 900° C.

* * * * *